United States Patent [19]

Matsuyama et al.

[11] Patent Number: 4,873,125
[45] Date of Patent: Oct. 10, 1989

[54] METHOD FOR FORMING DEPOSITED FILM

[75] Inventors: Jinsho Matsuyama, Nagahama; Yutaka Hirai, Hikone; Masao Ueki, Urayasu; Akira Sakai, Nagahama, all of Japan

[73] Assignee: Canon Kabushiki Kaisha, Tokyo, Japan

[21] Appl. No.: 30,115

[22] Filed: Mar. 26, 1987

[30] Foreign Application Priority Data

Mar. 31, 1986 [JP] Japan .................................. 61-073092

[51] Int. Cl.$^4$ ............................................. C23C 16/00
[52] U.S. Cl. .................................. 427/248.1; 427/255; 427/255.1; 427/255.2; 427/255.3; 427/255.4; 427/255.7
[58] Field of Search ............... 427/248.1, 255.2, 255.1, 427/255.3, 255.4, 255, 255.7

[56] References Cited

U.S. PATENT DOCUMENTS

| | | | |
|---|---|---|---|
| 4,217,374 | 8/1980 | Ovshinsky et al. | 427/248.1 |
| 4,226,898 | 10/1980 | Ovshinsky et al. | 427/39 |
| 4,504,518 | 3/1985 | Ovshinsky et al. | 427/38 |
| 4,522,663 | 6/1985 | Ovshinsky et al. | 427/39 |
| 4,568,626 | 2/1986 | Ogawa | 427/38 |
| 4,657,777 | 4/1987 | Hirooka et al. | 427/39 |

FOREIGN PATENT DOCUMENTS 2148328 5/1985 United Kingdom ............. 427/248.1

Primary Examiner—Norman Morgenstern
Assistant Examiner—Sadie Childs
Attorney, Agent, or Firm—Fitzpatrick, Cella, Harper & Scinto

[57] ABSTRACT

A method for forming deposited film, which comprises effecting a step [A] and another step [B] at least one time, the step [A] being the introduction of a starting material (A) which is either one of a gaseous starting material (I) for formation of a deposited film and a gaseous halogenic oxidizing agent (II) having the property of oxidative action on said starting material into a film forming space in which a substrate of which at least the surface to be filmed thereon has crystal orientability is previously arranged to have said starting material adsorbed onto the surface of said substrate to form an adsorbed layer (I) and the step [B] being the introduction of the other starting material (B) into said film forming space, thereby causing the surface reaction on said adsorption layer (I) to occur and form a deposited film.

14 Claims, 1 Drawing Sheet

METHOD FOR FORMING DEPOSITED FILM

BACKGROUND OF THE INVENTION

1. Field of the Invention

This invention relates to a method for formation of a deposited film, which is useful for the preparation of a functional film, particularly a semiconductive deposited film being useful for uses such as semiconductor device, electronic device such as optical input sensor device for optical image inputting device, photosensitive device for electrophotography, etc.

2. Description of the Related Art

Hitherto, for functional films, particularly crystalline semiconductor films, individually suitable film forming methods have been employed from the standpoint of desired physical characteristics, uses, etc.

For example, for formation of silicon deposited films such as amorphous or polycrystalline non-single crystalline silicon which are optionally compensated for lone pair electrons with a compensating agent such as hydrogen atoms (H) or halogen atoms (X), etc., (hereinafter abbreviated as "NON-Si (H,X)", particularly "A—Si (H,X)" when indicating an amorphous silicon and "poly—Si (H,X)" when indicating a polycrystalline silicon) (the so called microcrystalline silicon is included within the category of A—Si (H,X) as a matter of course), there have been attempted the vacuum vapor deposition method, the plasma CVD method, the thermal CVD method, the reactive sputtering method, the ion plating method, the optical CVD method, etc. Generally, the plasma CVD method has been used as the optimum method and industrialized.

However, the reaction process in formation of a silicon deposited film according to the plasma CVD method which has been generalized in the prior art is considerably complicated as compared with the CVD method of the prior art, and its reaction mechanism involves many ambiguous points. Also, there are a large number of parameters for formation of a deposited film such as substrate temperature, flow rate and flow rate ratio of the introduced gases, pressure during formation, high frequency power, electrode structure, structure of the reaction vessel, speed of evacuation, plasma generating system, etc. On a count of the use of a combination of such a large number of parameters, the plasma may sometimes become unstable state, whereby marked deleterious influences were exerted frequently on the deposited film formed. Besides, the parameters characteristic of the device must be selected for each device and therefore it has been difficult to generalize the production conditions under the present situation.

Also, in the case of the plasma CVD method, since plasma is generated by high frequency or microwave, etc., in the film forming space in which a substrate on which film is formed is arranged, electrons or a number of ion species generated thereby may give damages to the film in the film forming process to cause lowering in film quality or unevenness of film quality. Moreover, the conditions for crystallization of deposited film are narrow and therefore it has been deemed to be difficult to produce polycrystalline deposited films having stable characteristics.

Whereas, for formation of an epitaxial deposited film such as of silicon, germanium, the group II-VI and the group III-V semiconductors, etc., there have been used the gas phase epitaxy and the liquid phase epitaxy as classified broadly (generally speaking, the strict definition of epitaxy is to grow another single crystal on a single crystal, both having the same single crystal axes, but here epitaxy is interpreted in a broader sense and it is not limited to the growth onto a single crystal substrate).

The liquid phase epitaxy is a method for the deposition of a semiconductor crystal on a substrate by dissolving a starting material for semiconductor at an elevated temperature to a supersaturated state in a solvent of a metal which is molten to a liquid and cooling the solution. According to this method, since the crystals are prepared under the state most approximate to thermal equilibrium among various epitaxy techniques, crystals having high perfectness can be obtained, but on the other hand, mass productivity is poor and also the surface state is bad. For such reasons, in an optical device which requires an epitaxial layer which is thin and also uniform in thickness, problems are accompanied such as yield in device production, or influences exerted on the device characteristics, etc., and therefore this method is not frequently used.

On the other hand, the gas phase epitaxy has been attempted by physical methods such as the vacuum vapor deposition method, the sputtering method, etc., or chemical methods such as hydrogen reduction of a metal chloride, or thermal pyrolysis of an organic metal or a metal hydride. Among them, the molecular ray epitaxy which is a kind of the vacuum vapor deposition method is a dry process under ultra-high vacuum, and therefore high purification and low temperature growth of crystals are possible, whereby there is the advantage that composition and concentration can be well controlled to give a relatively even deposited film. However, in addition to an enormous cost required for the film forming device, the surface defect density is great, and no effective method for controlling directionality of molecular ray has been developed, and also enlargement of area is difficult and mass productivity is not so good. Due to such many problems, it has not been industrialized yet.

The hydrogen reduction method of a metal chloride or the thermal pyrolysis method of an organic metal or a metal hydride are generally called the halide CVD method, the hydride CVD method, the MO—CVD method. For these methods, since the film forming apparatus can be manufactured with relative ease and also metal chloride, metal hydrides, and organic metals being the starting materials, those with high purities are now readily available, they have been studied widely at the present time and application for various devices has been investigated.

However, in these methods, it is required to heat the substrate to at least an elevated temperature at which the reduction reaction or thermal pyrolysis reaction can occur and therefore the scope of choice of the substrate material is limited, and also contamination with impurities such as carbon or halogen, etc., is liable to be caused if decomposition of the starting material is insufficient, thus having the drawback that controllability of doping is poor. Also, depending on the application use of the deposited film, it is desired to effect mass production having reproducibility with full satisfaction of enlarged area, uniformization of film thickness as well as uniformness of film quality and yet at a high speed film formation, under the present invention. However, no technique which enables mass production while maintaining practical characteristics satisfying such demands has been established yet.

SUMMARY OF THE INVENTION

A principal object of the present invention is to provide a method for forming a deposited film which is easy in management of film quality simultaneously with effecting energy saving and can give a crystalline deposited film having uniform characteristics over a large area and excellent semiconductive characteristics.

Another object of the present invention is to provide a method for forming a deposited film which is excellent in productivity and mass productivity and can form simply and efficiently a crystalline deposited film having high quality and excellent physical characteristics such as electrical, optical, and semiconductive characteristics, etc.

According to the present invention, there is provided a method for forming a deposited film, which comprises effecting a step [a] and another step [b] at least one time, the step [a] being the introduction of a starting material (A) which is either one of a gaseous starting material for formation of a deposited film and a gaseous halogenic oxidizing agent having the property of oxidative action on said starting material into a film forming space in which a substrate of which at least the surface to be filmed thereon has crystal orientability is previously arranged to have said starting material adsorbed onto the surface of said substrate to form an adsorbed layer (I) and the step [b] being the introduction of the other starting material (B) into said film forming space, thereby causing the surface reaction on said adsorption layer (I) to occur and form a deposited film (I).

DETAILED DESCRIPTION OF THE PREFERRED EMBODIMENTS

Figure 1:
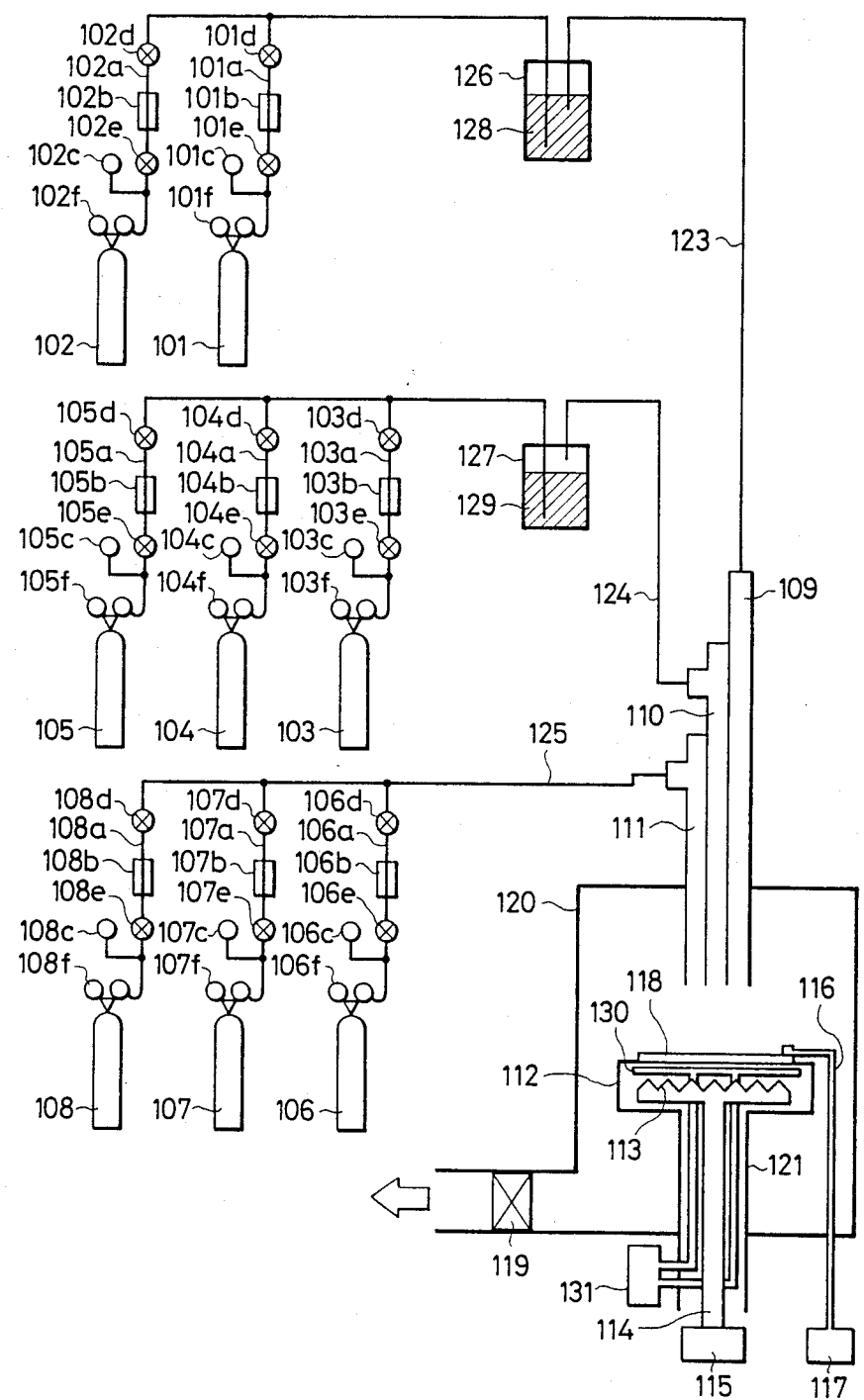
FIG. 1 is a schematic illustration of the film forming apparatus used in Examples of the present invention.

In the method for forming deposited film of the present invention, the gaseous starting material to be used for formation of a deposited film (hereinafter called "gaseous starting material") is a material which receives oxidation action through contact with a gaseous halogenic oxidizing agent (hereinafter called "halogenic oxidizing agent"), and may be selected suitably as desired depending on the kind, the characteristics, uses, etc. of the desired deposited film. In the method of the present invention, the above gaseous starting material and the halogenic oxidizing agent may be gaseous when introduced, and may be either gaseous, liquid or solid under ordinary state. In the case when the gaseous starting material or the halogenic oxidizing agent is liquid or solid under ordinary state, a carrier gas such as Ar, He, $N_2$, $H_2$, etc., is used and bubbling is effected optionally with heating to introduce either one of the gaseous starting material or the halogenic oxidizing agent in the gaseous state into the film forming space to form an adsorbed layer on the substrate having crystal orientability on the surface to be subjected to a film-forming treatment, and then the other material is introduced in the gaseous state.

During this operation, the introducing pressure of the above gaseous starting material or the halogenic oxidizing agent may be set by controlling the flow rate of the carrier gas or the vapor pressure of the gaseous starting material and the halogenic oxidizing agent. When the gaseous starting material or the halogenic oxidizing agent is a gas under normal state, it can be also introduced as diluted with a carrier gas such as Ar, He, $N_2$, $H_2$, etc., if necessary.

As the gaseous starting material to be used in the method of the present invention, for example, for obtaining a deposited film of silicon belonging to the group IV of the periodic table, there may be employed straight and branched chain silane compounds, cyclic silane compounds, etc., as effective ones.

As one capable of being such gaseous starting material, specifically, examples of the straight chain silane compounds may include $Si_nH_{2n+2}$ (n=1, 2, 3, 4, 5, 6, 7, 8), examples of branched chain silane compounds $SiH_3SiH(SiH_3)SiH_2SiH_3$, and examples of cyclic silane compounds $Si_nH_{2n}$ (n=3, 4, 5, 6), etc.

Of course, these silicon compounds may be used not only as one kind, but also as a mixture of two or more kinds.

The halogenic oxidizing agent to be used in the method of the present invention is made gaseous when introduced into the film forming space and at the same time has the property of exerting oxidation action effectively on the gaseous starting material for formation of deposited film only through contact therewith, and halogenic gases such as $F_2$, $Cl_2$, $Br_2$, $I_2$, ClF, etc., may be employed as effective ones.

Either one of these gaseous starting materials or halogenic oxidizing agent is first introduced in the form of a gas with desired flow rate and feeding pressure given into a film forming space in which a substrate for formation of deposited film is arranged to form an adsorbed layer on said substrate having a surface of crystal orientability, and then the other is introduced after desired time with desired flow rate and feeding pressure given, whereby the both are collided against each other on the surface of the above adsorbed, layer to cause a surface chemical reaction to occur, whereby the above halogenic oxidizing agent exerts oxidation reaction on the above gaseous starting material to form a deposited film on the substrate having the surface of crystal orientability as mentioned above. Such deposited film forming process of the present invention can proceed with better efficiency and with more saving of energy, whereby a deposited film having desired good physical characteristics over the whole film surface can be formed at a lower substrate temperature than in the prior art.

According to another aspect of the above present invention, there is provided a method for forming deposited film of the present invention, which comprises the formation of a deposited film without through the plasma reaction by use of the halogenic oxidizing agent in place of the plasma CVD method of the prior art which forms plasma discharging by permitting discharging energy, etc., to act on the starting gas for formation of the deposited film, and by doing so, it has the advantage that no bad influence by etching or abnormal discharging, etc., during film formation will be received.

According to a further aspect of the present invention, there is provided a method for forming deposited film, which comprises the formation of a very thin deposited film on a substrate by adsorbing either one of the gaseous starting material and the halogenic oxidizing agent having the oxidation action on said starting material onto the substrate having a surface of crystal orientability to form an adsorbed layer before introduction of the other, and by doing so there is the advantage that a deposited film with uniform film thickness and excellent crystallinity can be obtained.

According to a still further aspect of the present invention, there is provided a method for forming deposited film, which utilizes the redox reaction of the gaseous starting material containing an element which becomes the constituent elements of the deposited film with the halogenic oxidizing agent and requires no high temperature for deposition, and therefore there is no disturbance of the structure by heat, and no heating installation during production and no expense accompanied with running thereof are required, whereby the device can be made lower in cost.

And, it becomes possible to select the substrate material from a wide scope of materials without depending on heat resistance.

Also, the method for forming deposited film of the present invention forms a deposited film according to the reaction between the gaseous starting material and the halogenic oxidizing agent which progresses as concerned with the adsorbed molecules, and therefore enlargement of area is possible not depending on the shape and the size of the substrate, and at the same time the starting materials employed may be very small in amounts, whereby the film forming space can be made smaller to improve dramatically the yield.

Also, according to the method for forming deposited film of the present invention having the constitution as described above, energy saving during formation of deposited film can be effected and at the same time management of film quality can be easily done, whereby it becomes possible to form a good crystalline deposited film having uniform film quality and characteristics over a large area. Further, it is possible to obtain efficiently a crystalline film which is excellent in productivity and mass productivity, of high quality and also excellent in various characteristics such as electrical, optical, semiconductive characteristics, etc.

In the method of the present invention, so that the deposited film forming process may proceed smoothly and a film having desired physical characteristics of high quality may be formed, as the film forming factors, the kinds and combinations of the gaseous starting material for formation of deposited film and the halogenic oxidizing agent, the pressure during the reaction, the flow rate, the inner pressure in the film forming space, the kind of the substrate, the pressure during adsorption, the flow rates of the gases, the adsorption temperature and the film forming temperature (substrate temperature and atmosphere temperature) may be selected suitably as desired. These film forming factors are related organically, and they are not determined individually but determined respectively under mutual relationships. In the method of the present invention, the process of adsorption and reaction of the gaseous starting material for formation of deposited film and the halogenic oxidizing agent to be introduced into the film forming space may be determined suitably as desired in the relationship with the film forming factors concerned among the film forming factors as mentioned above.

The conditions in the step of forming an adsorbed layer on the substrate in the method for forming deposited film of the present invention are suitably set.

In adsorption of gas molecules onto a solid surface, there exists intramolecular forces, and the chemical adsorption with valence energy is greater in its intramolecular force than the physical adsorption with dispersion energy (corresponding to Van der Waals force).

Also, while physical adsorption is liable to become a multi-layer adsorption, a chemical adsorption is a monomolecular layer adsorption, and therefore for controlling deposition of a homogeneous thin film, the adsorption should also finally be preferably in the form of the chemical adsorption.

However, in the present invention, physical adsorption and chemical adsorption of gas molecules may be considered to be related with each other complicatedly in the processes from the formation of an adsorbed layer to the formation of a deposited film by a reaction of said adsorbed layer, and the form of adsorption is not necessarily limited. On the other hand, the factors which determine the adsorption state may include the kind of the adsorbed molecules, the kind of the solid surface and the surface state, and further temperature and pressure as controlling factors, and it is at least necessary to determine these controlling factors so that the reaction may be carried out to give a desired deposited film.

That is to say, if the pressure in the vacuum chamber is too low in the course from adsorption to reaction, desorption from the state of physical adsorption is liable to occur, while if the temperature is too high, dissociating adsorption from the state of chemical adsorption is liable to occur, and therefore the reaction process suitable for a desired deposited film must be selected.

In one cycle for formation of a deposited film of the present invention, which comprises the step [a] for the formation of an adsorbed layer and the step [b] of the reaction of said adsorbed layer with a starting material, as the steps prior to uniform formation of a desired deposited film on the substrate surface, there are the following steps. That is, there is the step of introducing the starting material (A) into the film forming space and permitting it in a suitable amount adsorbed on the substrate (the first step: Step [a]) to form an adsorbed layer. And, there is further the step of permitting the starting material (A) to remain in the adsorbed layer and discharging superfluous starting material (A) (the second step). In these steps, the pressures may be set suitably for the above reasons, and the pressure in the first step [a] may be preferably higher for sufficient progress of adsorption, preferably $1 \times 10^{-7}$ to 10 Torr, more preferably $1 \times 10^{-4}$ to 1 Torr.

The pressure in the second step may be preferably lower for discharging superfluous starting material A, preferably $1 \times 10^{-10}$ to 1 Torr, more preferably $1 \times 10^{-9}$ to $1 \times 10^{-2}$ Torr.

Further, one cycle for formation of deposited film of the present invention comprises subsequent to these steps the step of introducing the starting material B into the film forming space to cause the surface reaction with the adsorbed layer on the substrate to form a deposited film (the third step: Step [b]), and next the step of discharging the byproducts formed other than the deposited film at this time (the fourth step), and the pressure during the reaction in the third step may be preferably higher in order to enhance the probability of the contact between the starting materials (A) and (B), but the final value is determined suitably as desired in view of the reactivity.

The pressure in the third step may be preferably $1 \times 10^{-8}$ to 10 Torr, more preferably $1 \times 10^{-6}$ to 1 Torr.

The pressure in the fourth step may be preferably $1 \times 10^{-12}$ to 1 Torr.

In the present invention, the said steps [a] and [b] are carried out at least one time. However, in some cases, the steps [a] and [b] may be repeated in a desired number of times in this order. At this case, the periods for the steps [a] and [b] may be equal or unequal in each cycle.

As the substrate material having a crystal of crystal orientability which is the specific feature of the present invention, the following conditions are necessary to effect crystal growth on a substrate of a different material.

1. The lattice constant of the single crystalline or poly-crystalline material on the substrate surface should be identical with or very approximate to the lattice constant of the deposited film.

2. The coefficients of thermal expansion of the single crystalline or poly-crystalline material on the substrate surface and the deposited film should be identical with or very approximate to each other.

Hence, for example, as the material which should constitute the surface of a suitable substrate for obtaining a deposited film of crystalline Si, there may be included $CaF_2$, ZnS, Yb, $Mn_3Ga$, $NaCoF_3$, $Ni_3Sn$, $Fe_3C$, $NiTe_x$ (x<0.7), $CoMnO_3$, $NiMnO_3$, $MaZn_3$, CuCl, AlP, Si, etc. Even when the above two conditions are slightly satisfied, by selecting the deposition conditions more adequately, a crystalline deposited film can be also obtained, and the present invention is not limited only to the materials as described above.

The method of the present invention is described in more detail by use of Examples, but the . present invention is not limited by these Examples.

FIG. 1 shows one Example of a preferable apparatus for embodying the method for formation of deposited film of the present invention.

The apparatus for forming deposited film shown in FIG. 1 is classified broadly into the three of the main device, the discharging system and the gas feeding system.

The main device is provided with a film forming space.

101 to 108 are respectively bombs filled with the gases to be used during film formation, 101a–108a are respectively gas feeding pipes, 101b–108b are respectively mass flow controllers for controlling the flow rates of the gases from the respective bombs, 101c–108c are respectively gas pressure gauges, 101d–108d and 101e–108e are respectively valves, and 101f–108f are respectively pressure gauges indicating the pressures in the corresponding gas bombs.

120 is a vacuum chamber, having a structure such that a pipeline for introduction of gas is provided at the upper portion and a reaction space is formed downstream of the pipeline, and also having a structure such that a film forming space provided with a substrate holder 112 may be formed so that a substrate 118 may be placed as opposed to the gas introducing inlet of said pipeline. The pipeline . for introduction of gas has a three-tubular arrangement structure, having from the innerside a first gas introducing pipe 109 for introducing gases for the gas bombs 101 and 102, a second gas introducing pipe 110 for introducing the gases from the gas bombs 103–105, and a third gas introducing pipe 111 for introducing the gases from the gas bombs 106–108.

Feeding of the gases from the bombs to the respective introducing pipes is done through the gas feeding pipelines 123–125, respectively.

The respective gas introducing pipes, the respective gas feeding pipelines, and the vacuum chamber 120 are evacuated to vacuum by a vacuum evacuating device not shown through the main vacuum valve 119.

The substrate 118 can be set freely at any desired position from the respective gas introducing pipes by moving the substrate holder 112 vertically and in the directions of X and Y.

In the case of the method of the present invention, the distance between the substrate and the gas introducing inlet of the gas introducing pipe may be determined appropriately in view of the kinds of the deposited film to be formed, its desired characteristics, gas flow rates, the inner pressure in the vacuum chamber, etc., but it should preferably several mm to 20 cm, more preferably about 5 mm to 15 cm.

130 is a cooling pipe for making the gas molecules of the starting material A easily adsorbable onto the substrate 118, and it is connected to the flow rate controller 131. Cooling can be also used during film formation or after film formation other than in the first and the second steps in which adsorption is effected.

113 is a heater for heating the substrate, which heats the substrate 118 to an appropriate temperature during film formation, preheats the substrate 118 before film formation, and further, after film formation, heats the film for annealing.

To the heater 113 for heating the substrate is fed power from the power source 115 through the wire 114.

116 is a thermocouple for measuring the temperature of the substrate (Ts) and is connected electrically to the temperature display apparatus 117.

126 and 127 are bubblers for liquid starting materials, and used with filling of liquid starting materials 128 and 129 for formation of deposited film, respectively. When the starting materials for formation of deposited film are gases under ordinary state, it is not necessary to use bubblers for liquid starting materials.

EXAMPLE 1

By means of the film forming apparatus having a constitution similar to one shown in FIG. 1, a deposited film having good quality was prepared as described below.

First, the vacuum chamber 120 was evacuated under sufficient baking by means of an evacuating apparatus not shown to $5 \times 10^{-9}$ Torr. The $SiH_4$ filled in the bomb 101 was permitted to flow at a flow rate of 4 sccm through the gas introducing pipe 109 into the vacuum chamber 120 for 0.2 sec under the state maintained at an evacuating speed of 0.1 mTorr/sec by controlling the evacuating valve 119. Subsequently, the valve 101d was closed to stop feeding of the $SiH_4$ gas, and the evacuation valve 119 was controlled to a vacuum degree of 10 mTorr.

The $F_2$ gas (diluted to 10% with He) filled in the bomb 107 was introduced at 5 sccm through the gas introducing pipe 111 into the vacuum chamber 120. The evacuation rate at this time was controlled to 0.8 mTorr/sec by controlling the evacuating valve 119, and after this state was maintained for 0.2 sec, the valve 107a was closed to stop feeding of $F_2$ gas, and the vacuum degree was maintained at 4 mTorr for 2 sec. by controlling the evacuation valve 119.

As the substrate, a single crystalline silicon was used, and the substrate temperature was 340° C.

For the respective samples obtained by the repetition of the above procedure, crystallinity of the deposited film was evaluated by the X-ray diffraction method and the electron beam diffraction method, whereby they were confirmed to be polycrystalline silicon films. Further, the grain size of the polycrystalline silicon determined by the Scherrar method was found to be 3.5 μm. There was substantially no variance in crystal grain sizes over the whole surface of the substrate.

When the surface state of each sample was observed by a scanning type electron microscope, the smoothness was good without wavy pattern, etc., and the film thickness irregularity t was ±5% or less. Also, concerning electrical characteristics, they were formed to be superior to the polycrystalline silicon prepared according to the prior art, as summarized in Table 1.

EXAMPLE 2

By the use of a substrate of 5 cm×5 cm CaF$_2$ single crystal, a polycrystalline Si of good quality was formed as described below by means of the deposited film forming apparatus having a constitution similar to one shown in FIG. 1.

First, the vacuum chamber 120 was evacuated under sufficient baking by means of an evacuating apparatus not shown to 5×10$^{319}$ Torr The SiH$_4$ filled in the bomb 101 permitted to flow at a flow rate of 6 sccm through the gas introducing pipe 109 into the vacuum chamber 120 for 0.4 sec under the state maintained at an evacuating speed of 0.1 mTorr/sec by controlling the evacuating valve 119. Subsequently, the valve 101d was closed to stop feeding of the SiH$_4$ gas, and the state controlled to a vacuum degree of 40 mTorr by controlling the evacuating valve 119 was maintained for 3 sec.

The F$_2$ gas (diluted to 10% with He) filled in the bomb 107 was introduced at 8 sccm through the gas introducing pipe 111 into the vacuum chamber 120. The evacuation rate at this time was controlled to 0.8 mTorr/sec by controlling the evacuating valve 119, and after this state was maintained for 0.4 sec, the valve 107a was closed to stop feeding of F$_2$ gas, and the vacuum degree was maintained at 5 mTorr for 4 sec by controlling the evacuating valve 119.

The substrate temperature was 350° C.

For the respective samples obtained by the repetition of the above procedure, crystallinity of the deposited film was evaluated by the X-ray diffraction method and the electron beam diffraction method, whereby they were confirmed to be polycrystalline silicon films. Further, the grain size of the polycrystalline silicon determined by the Scherrar method was found to be about 3.3 μm. There was substantially no variance in crystal grain sizes over the whole surface of the substrate.

When the surface state of each sample was observed by a scanning type electron microscope, the smoothness was good without wavy pattern, etc., and the film thickness irregularity t was ±5% or less. Also, concerning electrical characteristics, they were formed to be superior to the polycrystalline silicon prepared according to the prior art, as summarized in Table 1.

EXAMPLE 3

By the use of a substrate of 5 cm×5 cm ZnS single crystal, a polycrystalline Si of good quality was formed as described below by means of the deposited film forming apparatus having a constitution similar to one shown in FIG. 1.

First, the vacuum chamber 120 was evacuated under sufficient baking by means of an evacuating device not shown to 5×10$^{-9}$ Torr. The SiH$_4$ filled in the bomb 101 was permitted to flow at a flow rate of 7 sccm through the gas introducing pipe 109 into the vacuum chamber 120 for 0.5 sec under the state maintained at an evacuating speed of 0.1 mTorr/sec by controlling the evacuating valve 119. Subsequently, the valve 101d was closed to stop feeding of the SiH$_4$ gas, and the vacuum degree was maintained at 60 mTorr for 3 sec by controlling the evacuating valve 119.

The F$_2$ gas (diluted to 10% with He) filled in the bomb 107 was introduced at 9 sccm through the gas introducing pipe 111 into the vacuum chamber 120. The evacuation rate at this time was controlled to 0.8 mTorr/sec by controlling the evacuating valve 119, and after this state was maintained for 0.7 sec, the valve 107a was closed to stop feeding of F$_2$ gas, and the vacuum degree was maintained at 6 mTorr for 5 sec by controlling the evacuating valve 119.

The substrate temperature was 370° C.

For the respective samples obtained by the repetition of the above procedure, crystallinity of the deposited film was evaluated by the X-ray diffraction method and the electron beam diffraction method, whereby they were confirmed to be polycrystalline silicon films. Further, the grain size of the polycrystalline silicon determined by the Scherrar method was found to be about 3 μm. There was substantially no variance in crystal grain sizes over the whole surface of the substrate.

When the surface state of each sample was observed by a scanning type electron microscope, the smoothness was good without wavy pattern, etc., and the film thickness irregularity t was ±5% or less. Also, concerning electrical characteristics, they were formed to be superior to the polycrystalline silicon prepared according to the prior art, as summarized in table 1.

As described above, the method for forming deposited film of the present invention can form a deposited film only by contacting a gaseous starting material with a gaseous halogenic oxidizing agent, and has the advantage of requiring particularly no reaction exciting energy from the outside. Accordingly, it becomes possible to lower the substrate temperature. Also, by heat treatment of the deposited film during film formation by means of an excited energy generating device, any desired crystalline deposited film can be formed. Further, simultaneously with saving of energy, it is possible to obtain a crystalline deposited film having uniform film quality and characteristics over a large area with easy management of the film quality. Further, a crystalline film excellent in productivity, mass productivity and having high quality with excellent electrical, optical, semiconductive, and other physical properties can be obtained with ease.

TABLE 1

| Example | σd (S · cm$^{-1}$) | Electron mobility (cm/V · sec) |
| --- | --- | --- |
| 1 | 5 × 10$^{-5}$ | 400 |
| 2 | 4 × 10$^{-5}$ | 370 |
| 3 | 1 × 10$^{-5}$ | 310 |

We claim:

1. A method for forming a deposited film using starting materials (A) and (B), which comprises:
   introducing one of the starting materials into a film forming space having a substrate therein; said substrate having a surface with crystal orientability;
   allowing said one starting material to adsorb onto said surface of said substrate to thereby form an adsorption layer; and
   introducing the other starting material into said film forming space, to thereby cause a surface reaction on said adsorption layer to form a deposited film;

said starting material (A) being a gaseous starting material for forming a deposited film; and starting material (B) being a gaseous halogenic oxidizing agent capable of having an oxidative action on said starting material (A).

2. A method for forming deposited film according to claim 1, wherein said adsorption layer is formed by the adsorption of said gaseous halogenic oxidizing agent onto said substrate surface.

3. A method for forming deposited film according to claim 1, wherein said adsorption layer is formed by the adsorption of said gaseous starting material for formation of deposited film onto said substrate surface.

4. A method for forming a deposited film according to claim 1, further comprising:
   feeding one of said starting materials (A) to (B) into the film forming space and allowing said starting material to adsorb onto the surface of said deposited film to thereby form a second adsorption layer; and
   feeding the other starting material into said film forming space to thereby cause a surface reaction on said second adsorption layer to form a second deposited film.

5. A method for forming deposited film according to claim 1, wherein said deposited film is crystalline.

6. A method for forming deposited film according to claim 1, wherein said gaseous starting material is a chain silane compound.

7. A method for forming deposited film according to claim 6, wherein said chain silane compound is a straight chain silane compound.

8. A method for forming deposited film according to claim 7, wherein said straight chain silane compound is represented by the formula $Si_nH_{2n+2}$ (n is an integer of 1 to 8).

9. A method for forming deposited film according to claim 6, wherein said chain silane compound is a branched chain silane compound.

10. A method for forming deposited film according to claim 1, wherein said gaseous starting material is a silane compound having a cyclic structure of silicon.

11. A method for forming deposited film according to claim 1, wherein said gaseous halogenic oxidizing agent contains a halogenic gas.

12. A method for forming deposited film according to claim 1, wherein said gaseous halogenic oxidizing agent contains fluorine gas.

13. A method for forming deposited film according to claim 1, wherein said gaseous halogenic oxidizing agent contains chlorine gas.

14. A method for forming deposited film according to claim 1, wherein said gaseous halogenic oxidizing agent is a gas containing fluorine atoms as the constituent.

* * * * *

UNITED STATES PATENT AND TRADEMARK OFFICE
CERTIFICATE OF CORRECTION

PATENT NO. : 4,873,125

DATED : October 10, 1989

INVENTOR(S) : JINSHO MATSUYAMA, ET AL.

It is certified that error appears in the above-identified patent and that said Letters Patent is hereby corrected as shown below:

COLUMN 1

Line 26, "so called" should read --so-called--.
    Line 45, "a count" should read --account--.

COLUMN 4

Line 37, "adsorbed, layer" should read --adsorbed layer,--.

COLUMN 6

Line 46, "starting material A," should read --starting material (A)--.
    Line 51, "starting material B" should read --starting material (B)--.

COLUMN 7

Line 54, "as opposed to" should read --opposite--.

COLUMN 8

Line 11, "preferably" should read --preferably be--.
    Line 14, "starting material A" should read --starting material (A)--.

UNITED STATES PATENT AND TRADEMARK OFFICE
CERTIFICATE OF CORRECTION

PATENT NO.  : 4,873,125
DATED       : October 10, 1989
INVENTOR(S) : JINSHO MATSUYAMA, ET AL.

It is certified that error appears in the above-identified patent and that said Letters Patent is hereby corrected as shown below:

COLUMN 9

Line 20, "5 X $10^{31}$ $^9$ Torr The SiH4" should read
　　　　　　 --5 X $10^{-9}$ Torr. The $SiH_4$--.
　　Line 21, "permitted" should read --was permitted--.

COLUMN 10

Line 30, "table 1." should read --Table 1.--.

COLUMN 11

Line 2, "and starting" should read --and said starting--.

Signed and Sealed this

Twenty-second Day of September, 1992

Attest:

DOUGLAS B. COMER

Attesting Officer　　　　Acting Commissioner of Patents and Trademarks